(12) United States Patent
Ooshima et al.

(10) Patent No.: US 11,742,256 B2
(45) Date of Patent: Aug. 29, 2023

(54) SEMICONDUCTOR DEVICE

(71) Applicant: DENSO CORPORATION, Kariya (JP)

(72) Inventors: Masanori Ooshima, Kariya (JP); Tomomi Okumura, Kariya (JP); Takahiro Hirano, Toyota (JP)

(73) Assignee: DENSO CORPORATION, Kariya (JP)

( * ) Notice: Subject to any disclaimer, the term of this patent is extended or adjusted under 35 U.S.C. 154(b) by 343 days.

(21) Appl. No.: 17/213,774

(22) Filed: Mar. 26, 2021

(65) Prior Publication Data

US 2021/0217680 A1 Jul. 15, 2021

Related U.S. Application Data

(63) Continuation of application No. PCT/JP2019/036740, filed on Sep. 19, 2019.

(30) Foreign Application Priority Data

Oct. 2, 2018 (JP) .................. 2018-187406

(51) Int. Cl.
*H01L 23/367* (2006.01)
*H01L 23/10* (2006.01)
*H01L 23/31* (2006.01)

(52) U.S. Cl.
CPC .......... *H01L 23/3677* (2013.01); *H01L 23/10* (2013.01); *H01L 23/31* (2013.01)

(58) Field of Classification Search
CPC ...... H01L 23/3677; H01L 23/10; H01L 23/31
See application file for complete search history.

(56) References Cited

U.S. PATENT DOCUMENTS

| 2015/0187671 A1* | 7/2015 | Fukuda | H01L 23/49541 257/773 |
| 2016/0172266 A1* | 6/2016 | Kadoguchi | H01L 23/49548 257/717 |
| 2017/0278774 A1 | 9/2017 | Hayashi et al. | |
| 2018/0190608 A1* | 7/2018 | Gupta | H01L 23/49503 |

\* cited by examiner

*Primary Examiner* — Peniel M Gumedzoe
(74) *Attorney, Agent, or Firm* — POSZ LAW GROUP, PLC

(57) ABSTRACT

A semiconductor device incudes: a semiconductor chip that includes an active area and an outer peripheral area surrounding the active area; a metal member that includes one face including a mounting portion on which the semiconductor chip is mounted and a peripheral member surrounding the mounting portion; a joining member that connects the semiconductor chip and the metal member; and a sealing resin body. The metal member includes, as the peripheral portion, an adhesive portion that surrounds the mounting portion and adheres to the sealing resin body, and a non-adhesive portion that is placed between the mounting portion and the adhesive portion. An entire width is placed in an area overlapping the semiconductor chip in a projection view in a thickness direction of the semiconductor chip.

6 Claims, 7 Drawing Sheets

SEMICONDUCTOR DEVICE

CROSS REFERENCE TO RELATED APPLICATIONS

The present application is a continuation application of International patent Application No. PCT/JP2019/036740 filed on Sep. 19, 2019, which designated the U.S. and claims the benefit of priority from Japanese Patent Application No. 2018-187406 filed on Oct. 2, 2018. The entire disclosures of all of the above applications are incorporated herein by reference.

TECHNICAL FIELD

The present disclosure relates to a semiconductor device.

BACKGROUND

In a semiconductor device of a comparative example, a semiconductor chip and a metal member (heat sink) are connected via a joining member (solder), and sealed by a sealing resin body. The metal member includes a mounting portion of the semiconductor chip and a peripheral portion that surrounds the mounting portion on one face closer to the semiconductor chip. An adhesive portion to which the sealing resin body adheres is placed at the peripheral portion. An uneven oxide film (rough portion) is formed at the adhesive portion by irradiation with laser light.

SUMMARY

A semiconductor device may include: a semiconductor chip that may include an active area and an outer peripheral area surrounding the active area; a metal member that may include one face including a mounting portion on which the semiconductor chip may be mounted and a peripheral member surrounding the mounting portion; a joining member that may connect the semiconductor chip and the metal member; and a sealing resin body. The metal member may include, as the peripheral portion, an adhesive portion that may surround the mounting portion and adhere to the sealing resin body, and a non-adhesive portion that may be placed between the mounting portion and the adhesive portion. An entire width may be placed in an area overlapping the semiconductor chip in a projection view in a thickness direction of the semiconductor chip.

BRIEF DESCRIPTION OF THE DRAWINGS

A void may occur at a position adjacent to a joining portion due to air trapped in molding of the sealing resin body, air in a resin tablet that is material of the sealing resin body, vaporization of absorbed moisture, and the like. When a thick void that comes into contact with an end face of the semiconductor chip occurs, a strain of the joining member increases. In order to detect such voids, for example, SAT (Scanning Acoustic Tomograph) device is used.

However, when, at the peripheral portion, a non-adhesive portion having a lower adhesiveness to the sealing resin body than that of the adhesive portion is placed on an inner side of the joining portion, that is, the side close to the mounting portion, the void may not be detected. Specifically, the sealing resin body is peeled at the non-adhesive portion, the peeled part and the void overlap, and the peeled part and the void may not be distinguished.

One example of the present disclosure provides a semiconductor device capable of detecting voids with high accuracy.

According to one example embodiment, a semiconductor device includes: a semiconductor chip that includes an active area and an outer peripheral area surrounding the active area; a metal member that includes one face including a mounting portion on which the semiconductor chip is mounted and a peripheral member surrounding the mounting portion; a joining member that is interposed between the semiconductor chip and the mounting portion and connects the semiconductor chip and the metal member; and a sealing resin body that integrally seals the semiconductor chip, at least the one face of the metal member and the joining metal member.

The metal member includes, as the peripheral portion, an adhesive portion that surrounds the mounting portion and adheres to the sealing resin body, and a non-adhesive portion that is placed between the mounting portion and the adhesive portion, is not connected to the joining member, has lower adhesion to the sealing resin body than adhesion of the adhesive portion, and has an annular shape.

At, at least, a part of an entire length of the non-adhesive portion, an entire width is placed in an area overlapping the semiconductor chip in a projection view in a thickness direction of the semiconductor chip.

According to this semiconductor device, when the sealing resin body is peeled at a portion of the non-adhesive portion placed in the area overlapping the semiconductor chip, the entire area of the peeled part overlaps the semiconductor chip. On the other hand, when a thick void occurs and contacts not only the joining member but also the end face of the semiconductor chip, at least a part of the void is located on an outer side as compared with the semiconductor chip. At least a part of the void does not overlap the peeled part, and therefore it may be possible to distinguish the peeled part and the void. Accordingly, it may be possible to detect the void with higher accuracy.

Figure 1:
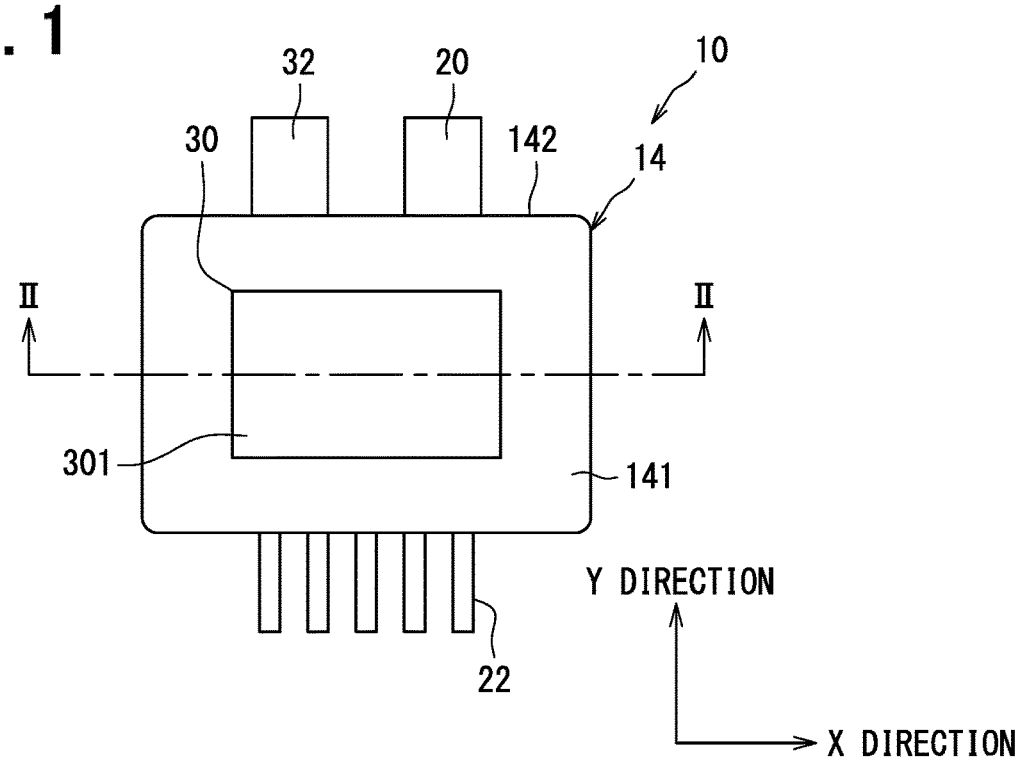
Figure 2:
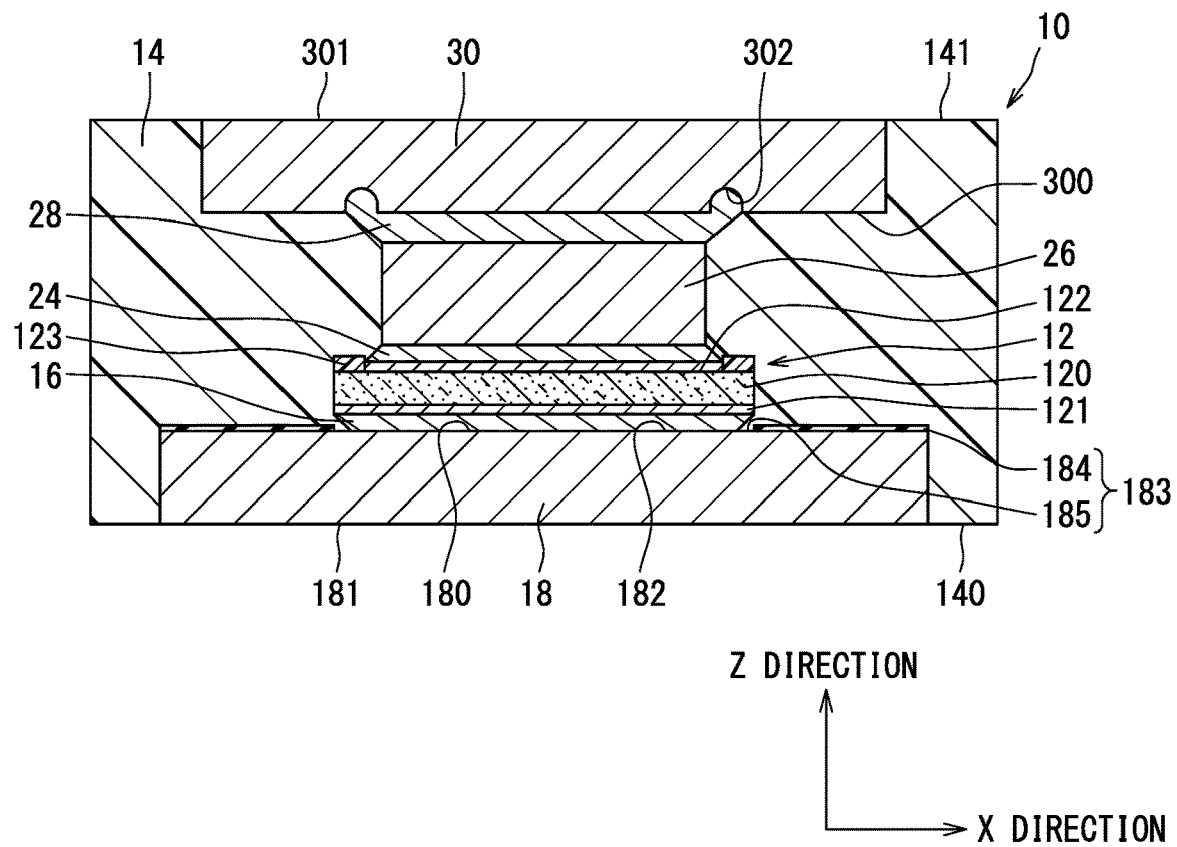
Figure 3:
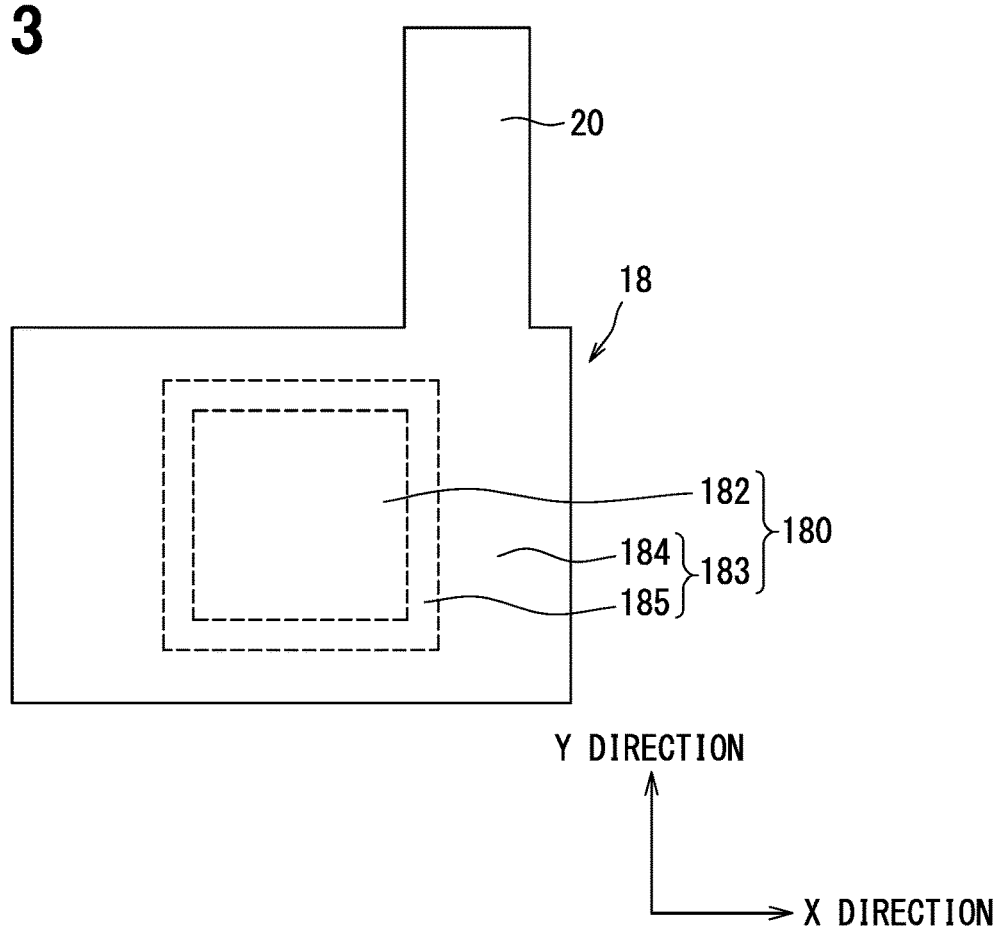
Figure 4:
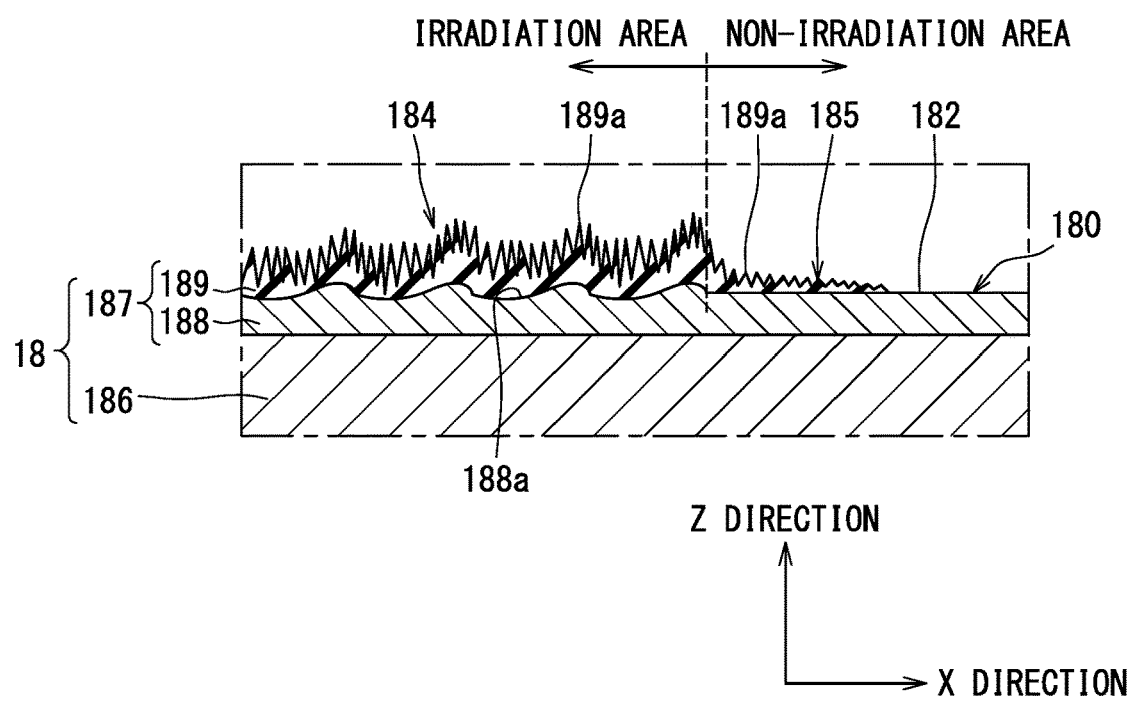
Figure 5:
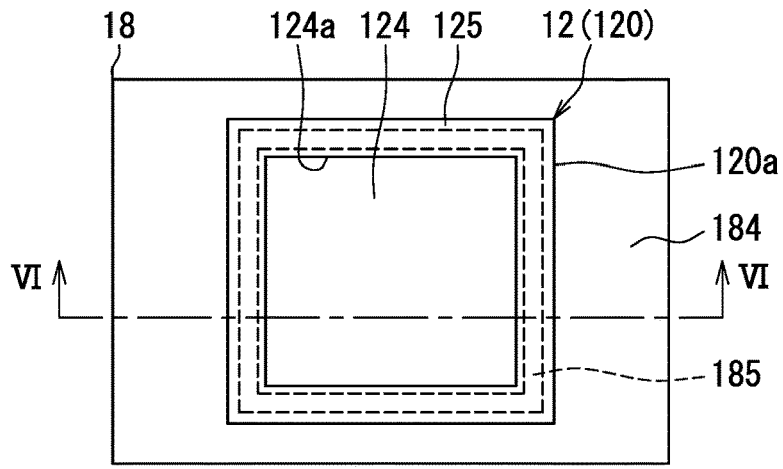
Figure 5:
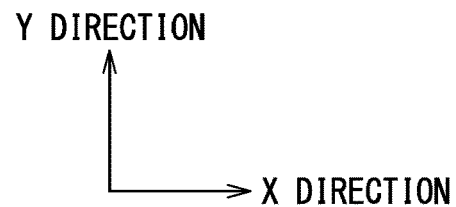
Figure 6:
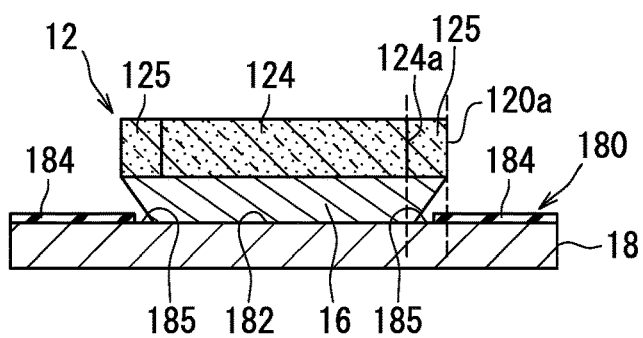
Figure 6:
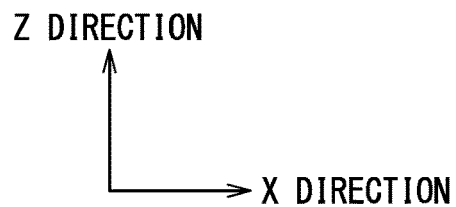
Figure 7:
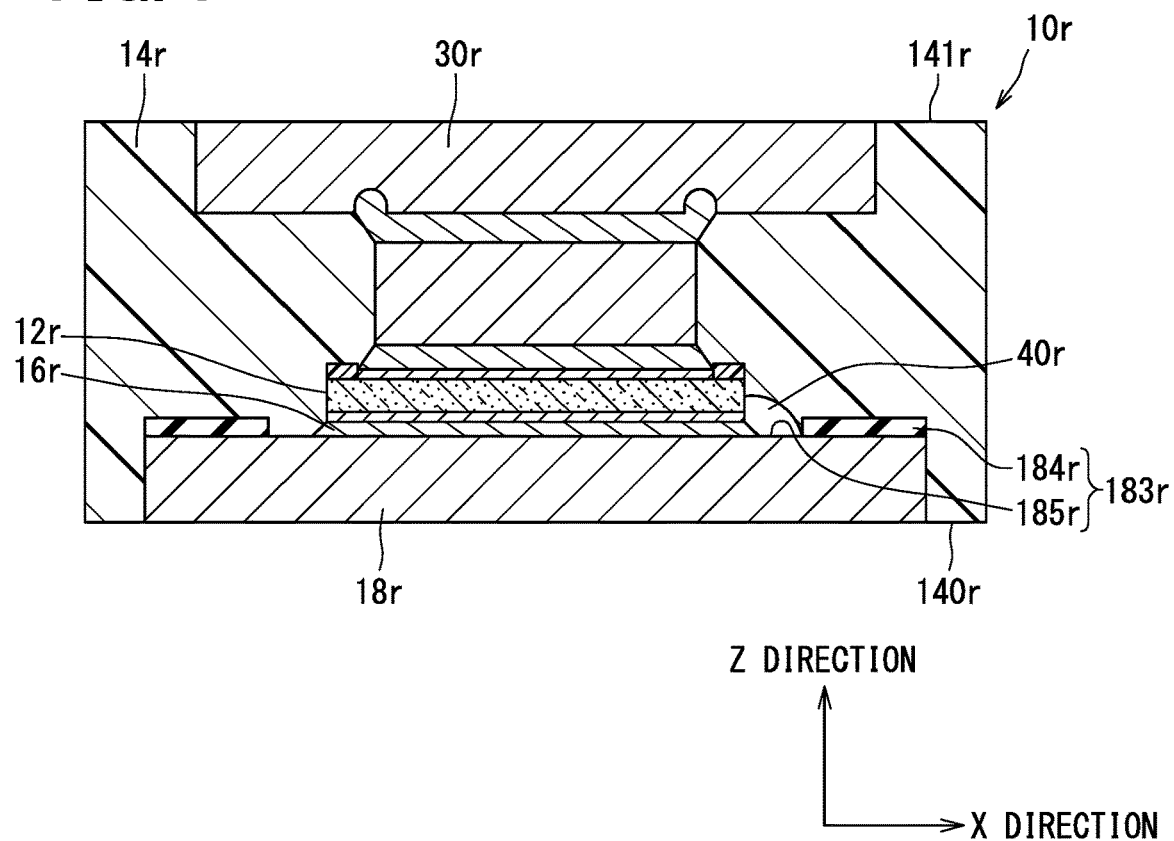
Figure 8:
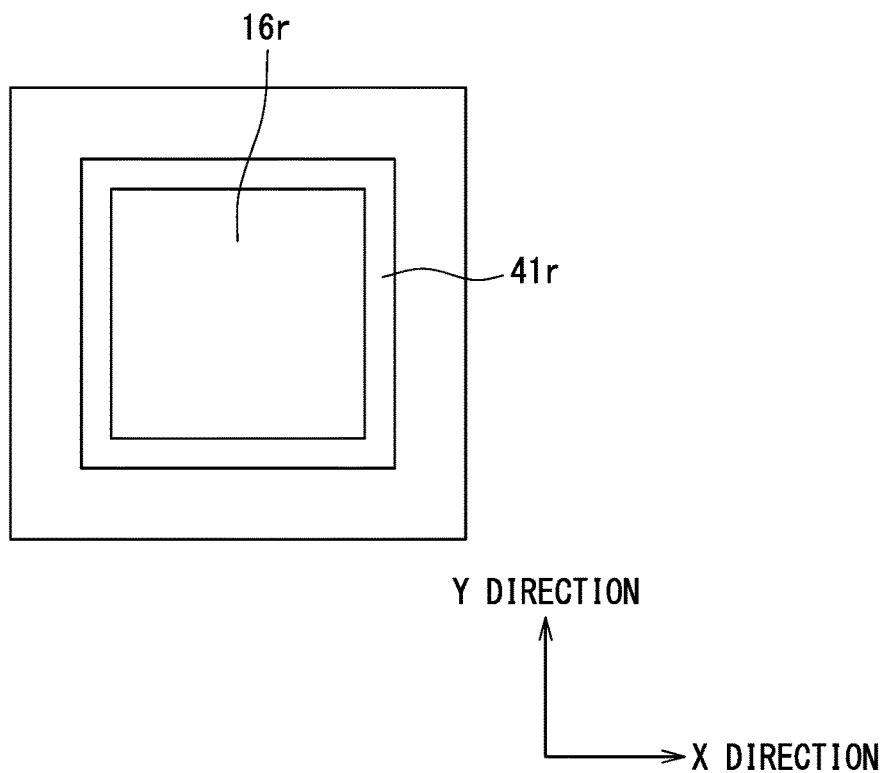
Figure 9:
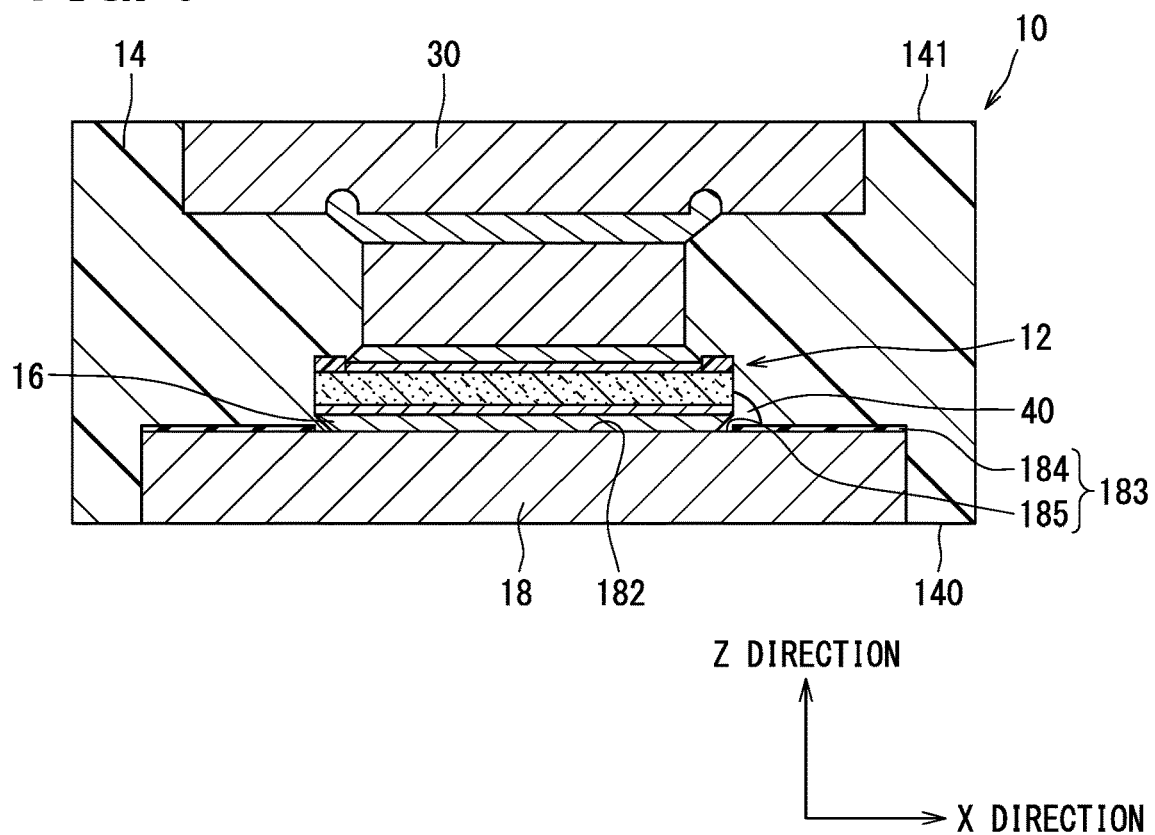
Figure 10:
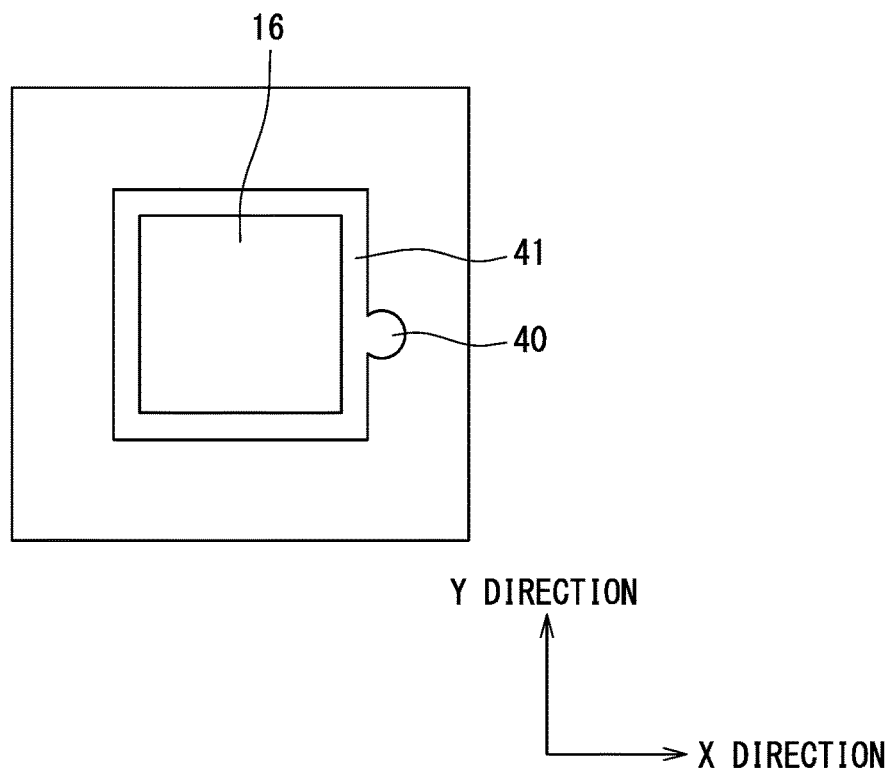
Figure 11:
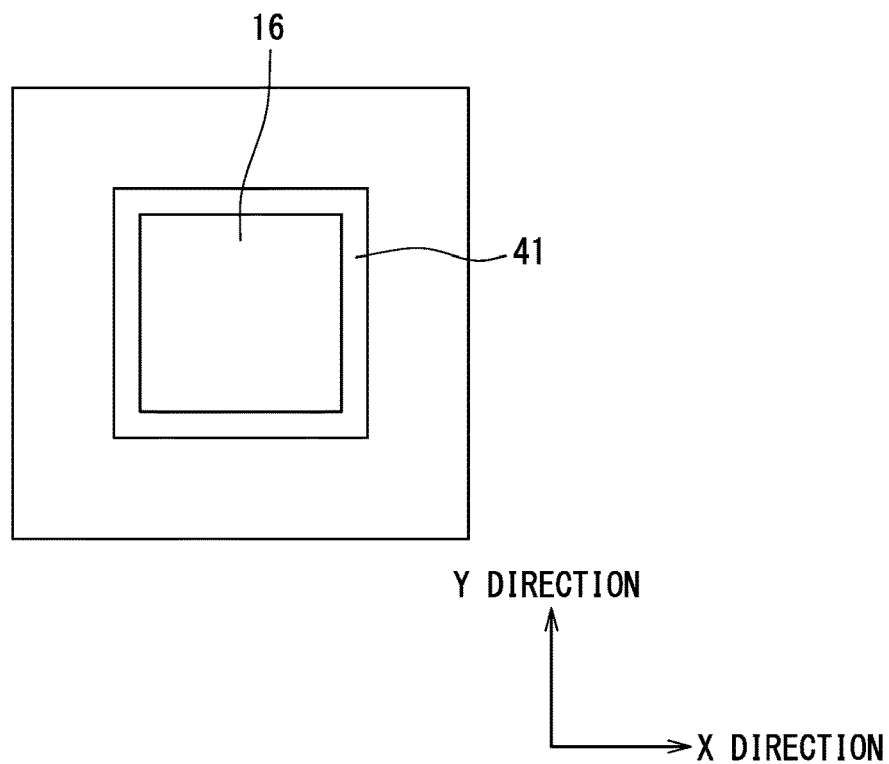
Figure 12:
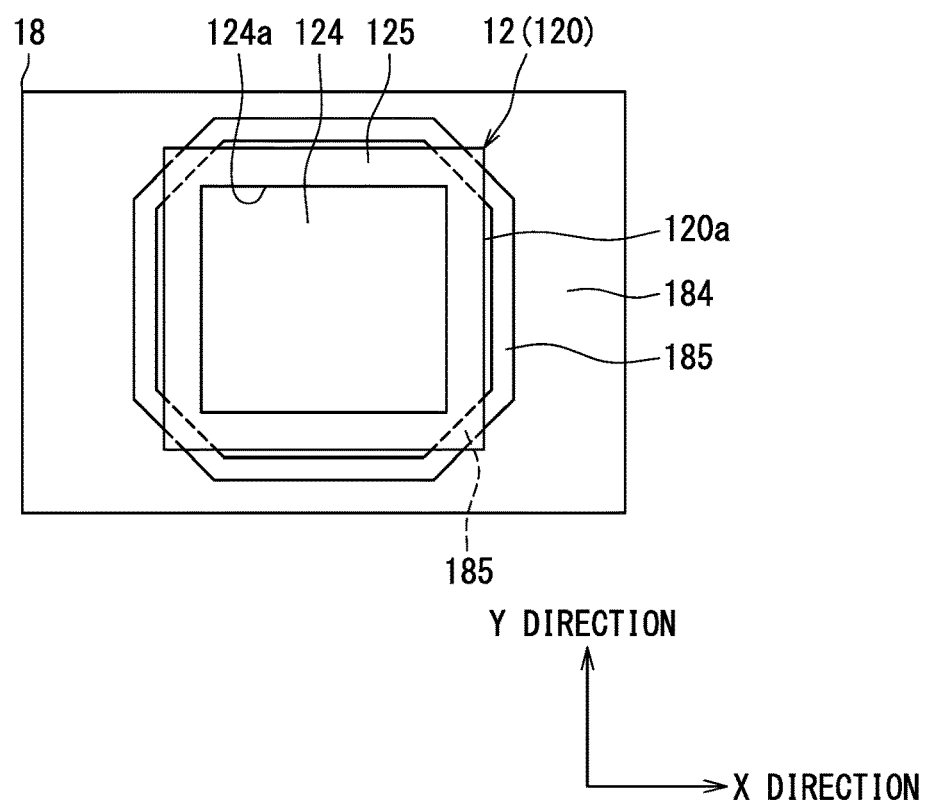
Figure 13:
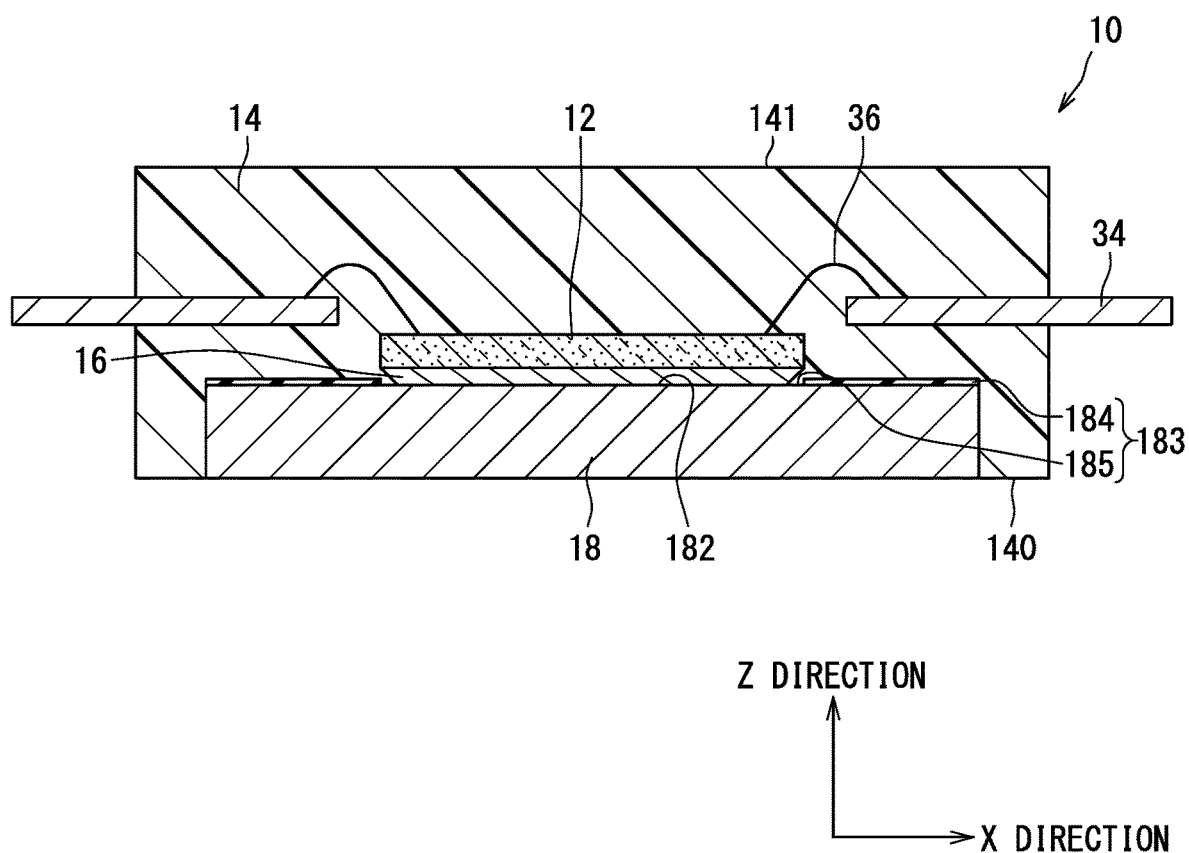

The above and other features and advantages of the present disclosure will be more clearly understood from the following detailed description with reference to the accompanying drawings. In the accompanying drawings, FIG. 1 is a plan view of a schematic configuration of a semiconductor device according to a first embodiment;

FIG. 2 is a sectional view taken along a line II-II in FIG. 1;

FIG. 3 is a plan view of a first heat sink seen from a side of one face;

FIG. 4 is an enlarged cross-sectional view of a vicinity of a surface layer on the side of the one face of the first heat sink;

FIG. 5 is a plan view showing a positional relationship between a semiconductor chip and the first heat sink;

FIG. 6 is a cross-sectional view taken along a line VI-VI in FIG. 5;

FIG. 7 is a cross-sectional view showing a comparative example of the semiconductor device and corresponding to FIG. 2;

FIG. 8 is a view showing a SAT image of the comparative example;

FIG. 9 is a view showing a state where a void occurs in the semiconductor device according to the first embodiment;

FIG. 10 is a view showing the SAT image of the state where the voids occur;

FIG. 11 is a view showing the SAT image of another state;

FIG. 12 is a plan view showing a positional relationship between the semiconductor chip and the first heat sink in a semiconductor device according to a second embodiment and corresponding to FIG. 5; and FIG. 13 is a cross-sectional view showing another modification and corresponding to FIG. 2.

DETAILED DESCRIPTION

Multiple embodiments will be described with reference to the drawings. In the embodiments, functionally and/or structurally corresponding parts are denoted by the same reference numerals. In the following description, a thickness direction of a semiconductor board is given as a Z direction and a direction orthogonal to the Z direction is given as an X direction. A direction orthogonal to both of the Z direction and the X direction is shown as a Y direction. Unless otherwise specified, a shape along an XY plane defined by the X direction and the Y direction is a planar shape.

First Embodiment

First, a schematic configuration of a semiconductor device will be described. The semiconductor device is suitable for an electric power conversion device such as an electric vehicle (EV) and a hybrid vehicle (HV). The semiconductor device is used for an electric power conversion device including an upper-lower arm circuit, for example, an inverter or a DCDC converter.

<Schematic Configuration of Semiconductor Device>

As shown in FIGS. 1 and 2, a semiconductor device 10 includes a semiconductor chip 12, a sealing resin body 14, a first heat sink 18, a main terminal 20, a signal terminal 22, a terminal 26, a second heat sink 30, and a main terminal 32.

The semiconductor chip 12 is provided by forming elements such as an insulated gate bipolar transistor (IGBT) on a semiconductor board 120 made of Si, SiC, GaN, or the like. In the present embodiment, as elements, an n-channel IGBT is formed and a freewheeling diode (FWD) connected in anti-parallel with the IGBT is formed. That is, an RC (reverse conducting)-IGBT is formed. The semiconductor board 120 has a substantially rectangular shape in a plan view.

Each of the IGBT and the FWD has what is called a vertical structure so that a current flows in the Z direction that is a thickness direction of the semiconductor board 120. Main electrodes are respectively formed on both faces in the Z direction of the semiconductor board 120. As the main electrodes, a collector electrode 121 is formed on the side of one face and an emitter electrode 122 is formed on the side of a back face opposite to the one face.

In the present embodiment, the collector electrode 121 also serves as a cathode electrode and the emitter electrode 122 also serves as an anode electrode of the FWD. The collector electrode 121 is formed on the entire back face of the semiconductor board 120. A protection film 123 made of polyimide or the like is formed on the one face of the semiconductor board 120 and the emitter electrode 122 is exposed from the protection film 123. That is, the emitter electrode 122 is formed on a part of the one face of the semiconductor board 120. Signal pads (not shown) are also exposed from the protection film 123. The signal pads include a pad for a gate electrode of the IGBT.

The sealing resin body 14 integrally seals the semiconductor chip 12 and component elements of the semiconductor device 10 other than the semiconductor chip 12. The sealing resin body 14 is a resin molded body. The sealing resin body 14 is formed by using epoxy-based resin, for example. In the present embodiment, the sealing resin body 14 is formed by a transfer molding method.

The sealing resin body 14 has a substantially rectangular shape in plan view. The sealing resin body 14 has one face 140 that is a face on one side and a back face 141 on an opposite side from the one face 140 as surfaces in the Z direction. The one face 140 and the back face 141 are substantially flat faces. The sealing resin body 14 has side faces 142 as parts of the surfaces. The side faces 142 are continuous with the one face 140 and the back face 141.

The first heat sink 18 is connected to the collector electrode 121 of the semiconductor chip 12 by solder 16. The solder 16 corresponds to a joining member, and the first heat sink 18 corresponds to a metal member. The first heat sink 18 dissipates heat, generated by the semiconductor chip 12, to an outside of the semiconductor device 10. The first heat sink 18 serves as an electrical relay between the semiconductor chip 12 and the main terminal 20 described later.

The first heat sink 18 has one face 180 that is a face on the side of the semiconductor chip 12 and a back face 181 on an opposite side to the one face 180 as surfaces in the Z direction. As shown in FIG. 2 and FIG. 3, the first heat sink 18 includes, on the one face 180, a mounting portion 182 and a peripheral portion 183. The mounting portion 182 is a portion of the one face 180, to which the solder 16 is connected, that is, a portion where the semiconductor chip 12 is mounted. The peripheral portion 183 is a portion of the one face 180 other than the mounting portion 182. The peripheral portion 183 surrounds the mounting portion 182.

The peripheral portion 183 includes an adhesive portion 184 and a non-adhesive portion 185. The sealing resin body 14 adheres to the adhesive portion 184. The adhesive portion 184 surrounds the mounting portion 182 at a position away from the mounting portion 182 so as not to be adjacent to the mounting portion 182. The portion between the mounting portion 182 and the adhesive portion 184 is formed as the non-adhesive portion 185. The non-adhesive portion 185 is adjacent to the mounting portion 182 and surrounds the mounting portion 182. In the present embodiment, the adhesive portion 184 is formed by a roughening treatment described later. That is, the adhesive portion 184 is formed by a roughened portion. The entire portion from the non-adhesive portion 185 to an outer peripheral edge of the one face 180 is formed as the adhesive portion 184. A width of the non-adhesive portion 185 is substantially constant throughout a periphery.

The non-adhesive portion 185 has lower adhesion to the sealing resin body 14 than the adhesive portion 184. The sealing resin body 14 does not adhere to the non-adhesive portion 185 and adheres to the adhesive portion 184. Details of the first heat sink 18 including the adhesive portion 184 and the non-adhesive portion 185 will be described later.

The back face 181 of the first heat sink 18 is exposed from the sealing resin body 14. The back face 181 is exposed to be substantially flush with the one face 140. In this manner, the back face 181 serves as a heat dissipating face for dissipating the heat to the outside of the semiconductor device 10. The surface other than the back face 181, for example, the one face 180 is covered with the sealing resin body 14.

The main terminal 20 is connected to the first heat sink 18. The main terminal 20 is electrically connected to the collector electrode 121 via the first heat sink 18. The main terminal 20 is formed to extend in the Y direction from the first heat sink 18 and protrudes outward from one of the side faces 142 of the sealing resin body 14. The main terminal 20 may be formed integrally with the first heat sink 18 as a part of a lead frame, or the main terminal 20 of the different member may be connected to the first heat sink 18. In the present embodiment, the main terminal 20 is integrally formed with the first heat sink 18. The main terminal 20 has a smaller thickness than the first heat sink 18. The main terminal 20 is connected to the one face 180 of the first heat sink 18 to be substantially flush with the one face 180.

The signal terminals 22 are electrically connected to the pads of the semiconductor chip 12 by bonding wires (not shown). As shown in FIG. 1, the signal terminals 22 are formed to extend in the Y direction. The signal terminals 22 protrude outward from the face opposite to the side face 142 from which the main terminal 20 protrudes.

The terminal 26 is connected to the emitter electrode 122 of the semiconductor chip 12 via solder 24. The terminal 26 is provided between the semiconductor chip 12 and the second heat sink 30. The terminal 26 functions as a spacer for securing heights of the above-described bonding wires. Instead of the terminal 26, the second heat sink 30 may be provided with a protrusion having the function of the spacer.

The terminal 26 includes a metal base made of Cu or the like. Heat generated by the semiconductor chip 12 is transferred to the second heat sink 30 via the terminal 26. The terminal 26 serves as an electrical relay between the emitter electrode 122 of the semiconductor chip 12 and the second heat sink 30.

The second heat sink 30 is connected to a face of the terminal 26 opposite from the semiconductor chip 12 by solder 28. The second heat sink 30 dissipates heat, generated by the semiconductor chip 12, to the outside of the semiconductor device 10. The second heat sink 30 serves as an electrical relay between the semiconductor chip 12 and the main terminal 32 described later. The second heat sink 30 includes a metal base made of Cu or the like.

The second heat sink 30 has one face 300 on the side of the semiconductor chip 12 and a back face 301 on an opposite side to the one face 300 as surfaces in the Z direction. The second heat sink 30 has a groove 302, which houses the spilling solder 28, in the one face 300. By housing the spilling solder 28 in the groove 302, it is possible to restrain the solder 28 from wetting and spreading toward the semiconductor chip 12 along side faces of the terminal 26.

The back face 301 of the second heat sink 30 is exposed from the sealing resin body 14. The back face 301 is exposed to be substantially flush with the back face 141. In this manner, the back face 301 serves as a heat dissipating face for dissipating the heat to the outside of the semiconductor device 10. The surface other than the back face 301, for example, the one face 300 is covered with the sealing resin body 14.

The main terminal 32 is connected to the second heat sink 30. The main terminal 32 is electrically connected to the emitter electrode 122 via the second heat sink 30. The main terminal 32 is formed on the same side as the main terminal 20 to extend in the Y direction from the second heat sink 30. The main terminal 32 protrudes outward from the same side face 142 as the main terminal 20. The main terminal 32 may be formed integrally with the second heat sink 30 as a part of a lead frame, or the main terminal 32 of the different member may be connected to the second heat sink 30. In the present embodiment, the main terminal 32 is integrally formed with the second heat sink 30. The main terminal 32 has a smaller thickness than the second heat sink 30. The main terminal 32 is connected to the one face 300 of the second heat sink 30 to be substantially flush with the one face 300.

In the semiconductor device 10 formed as described above, the sealing resin body 14 integrally seals the semiconductor chip 12, a part of the first heat sink 18, parts of the main terminals 20, 32, parts of the signal terminals 22, the terminal 26, and a part of the second heat sink 30. In the semiconductor device 10, the semiconductor chip 12 configuring the upper arm or the lower arm of the upper-lower arm circuit is sealed by the sealing resin body 14. Therefore, the semiconductor device 10 is also referred to as "1-in-1 package".

The first heat sink 18 and the second heat sink 30 are machined together with the sealing resin body 14. Therefore, the one face 140 and the back face 181 are machined faces and substantially flush with each other. Similarly, the back face 141 and the back face 301 are machined faces and substantially flush with each other. In this manner, the semiconductor device 10 has a double face heat dissipation structure with both of the back faces 181, 301 exposed from the sealing resin body 14.

As each of the solder 16, 24, 28, fluxless solder is used. The one face 140 and the back face 181 are not limited to the machined faces. The back face 141 and the back face 301 are not limited to the machined faces. By bringing the back faces 181, 301 in contact with wall faces of a mold for the sealing resin body 14, it is possible to make the back faces 181, 301 exposed from the sealing resin body 14 without machining.

<Detailed Structure of First Heat Sink>

As shown in FIG. 4, the first heat sink 18 has a base 186 made of metal material such as Cu and a film 187 provided at least on a side of the one face 180 of a surface of the base 186. The base 186 corresponds to a metal base. The base 186 has a substantially rectangular parallelepiped shape. The film 187 includes a metal thin film 188 formed on the surface of the base 186 and an uneven oxide film 189 that is an oxide of metal and has a continuously uneven surface, the metal being a main component of the metal thin film 188. FIG. 4 is an enlarged cross-sectional view of a part of a surface layer on the side of the one face 180 of the first heat sink.

In the present embodiment, the metal thin film 188 includes Ni as the main component. The metal thin film 188 is formed by plating, vapor deposition, or the like, for example. The metal thin film 188 is formed on the surface of the base 186 by electroless Ni plating, for example. The metal thin film 188 includes P (phosphorus) besides Ni that is the main component.

The metal thin film 188 is formed on a portion of the surface of the base 186 other than the back face 181. On the side of the one face 180, multiple recesses 188a are formed at a portion of a surface of the metal thin film 188 corresponding to the adhesive portion 184. That is, the recesses 188a are not formed at the mounting portion 182 and the non-adhesive portion 185. At the portion without the recesses 188a, the metal thin film 188 has a film thickness of about 10 μm, for example. In other words, the film thickness before application of a laser beam (described later) is about 10 μm.

The recesses 188a are formed by the application of the pulsed laser beam. One pulse forms each of the recesses 188a. The adjacent recesses 188a are formed continuously in a scanning direction of the laser beam. The multiple recesses 188a are continuous in the X direction and in the Y direction as well. At the adhesive portion 184, the surface of the metal thin film 188 has a scale-like structure formed by the plurality of recesses 188a. The portion corresponding to the adhesive portion 184 is an irradiated area with the laser beam and the portion corresponding to the mounting portion 182 and the non-adhesive portion 185 is an unirradiated area.

Each of the recesses 188a has a width of 5 μm to 300 μm. Each of the recesses 188a has a depth of 0.5 μm to 5 μm. When the depth of the recess 188a is smaller than 0.5 μm, melting and the vapor deposition of the surface of the metal thin film 188 by the application of the laser beam are insufficient, which makes formation of the uneven oxide film 189 difficult. When the depth of the recess 188a is larger than 5 μm, the surface of the metal thin film 188 is liable to melt and spatter and the melting and spattering become dominant over the vapor deposition in forming the surface, which makes the formation of the uneven oxide film 189 difficult.

The uneven oxide film 189 is formed on the metal thin film 188 on the side of the one face 180. The uneven oxide film 189 is not formed at the mounting portion 182 and formed at the peripheral portion 183, that is, the adhesive portion 184 and the non-adhesive portion 185. The uneven oxide film 189 is formed by applying the laser beam to the metal thin film 188. The uneven oxide film 189 is the film of the oxide formed on the surface of the metal thin film 188 by oxidizing the surface of the metal thin film 188. The uneven oxide film 189 is a laser irradiated film formed by the irradiation of the laser beam.

In the present embodiment, NI2O3, NiO, and Ni constitute 80%, 10%, and 10%, respectively, of the uneven oxide film 189. As described above, the main component of the uneven oxide film 189 is the oxide of Ni which is the main component of the metal thin film 188.

An average film thickness of the uneven oxide film 189 at the adhesive portion 184, that is, in the irradiated area with the laser beam is 10 nm to hundreds of nanometers. The uneven oxide film 189 is formed to conform to the recessed and protruding surface of the metal thin film 188 having the recesses 188a. On a surface of the uneven oxide film 189, recesses and protrusions are formed with a smaller pitch than widths of the recesses 188a. In other words, the extremely fine recesses and protrusions (a roughened portion) are formed. In other words, the multiple protrusions 189a (columnar bodies) are formed with the small pitch. For example, an average width of the protrusion 189a is 1 nm to 300 nm and an average interval between the protrusions 189a is 1 nm to 300 nm. An average height of the protrusion 189a is 10 nm to hundred nanometers.

In this manner, the adhesive portion 184 is formed by the uneven oxide film 189 having the extremely fine recesses and protrusions formed on the surface. An anchoring effect is exerted by the sealing resin body 14 that clings to the protrusions 189a on the surface of the uneven oxide film 189. Moreover, because the protrusions 189a are higher than at the non-adhesive portion 185, an area of contact with the sealing resin body 14 is larger. Thereby, the sealing resin body 14 adheres to the adhesive portion 184 of the one face 180.

Because the uneven oxide film 189 is formed by the melting and the vapor deposition of the surface of the metal thin film 188 by the application of the laser beam to the metal thin film 188, the uneven oxide film 189 is formed not only at the adhesive portion 184, which is the irradiated area with the laser beam, but also at a periphery of the adhesive portion 184. In the present embodiment, the uneven oxide film 189 is formed throughout the non-adhesive portion 185 and not formed in the mounting portion 182 in the unirradiated area with the laser beam. A width of the non-adhesive portion 185 throughout which the uneven oxide film 189 is formed is 0.2 mm to 0.3 mm.

However, the laser beam is not directly applied, and therefore an average film thickness of the uneven oxide film 189 at the non-adhesive portion 185 is smaller than the average film thickness of the uneven oxide film 189 at the adhesive portion 184 and larger than a natural oxide film. To put it concretely, the average film thickness is 0.1 nm to 10 nm. Heights of the protrusions 189a on the surface of the uneven oxide film 189 are smaller than at the adhesive portion 184. To put it concretely, the average film thickness is 0.1 nm to 10 nm. The average width of the protrusion 189a and the average interval between the protrusions 189a are about the same as at the adhesive portion 184.

By having the above-described uneven oxide film 189, the non-adhesive portion 185 has lower adhesion to the sealing resin body 14 than the adhesive portion 184. In this way, the sealing resin body 14 does not adhere to the non-adhesive portion 185. Moreover, by having the uneven oxide film 189, the non-adhesive portion 185 has lower wettability by the solder 16 than the mounting portion 182. That is, the solder 16 is less likely to wet and spread toward the non-adhesive portion 185 from the mounting portion 182. As a result, the solder 16 is not connected to the non-adhesive portion 185.

In forming the semiconductor device 10, the uneven oxide film 189 is formed in advance on the first heat sink 18 before performing reflow of the solder 16, 24, and 28. To form the uneven oxide film 189, the pulsed laser beam is applied to the area, where the adhesive portion 184 is to be formed, out of the surface of the metal thin film 188 on the side of the one face 180 of the first heat sink 18. Scanning with the laser beam is performed in the X direction so that adjacent spots (irradiated areas by one pulse) of the laser beam partially overlap each other in the X direction. Scanning with the laser beam is performed in the Y direction so that adjacent spots of the laser beam partially overlap each other in the Y direction. In this manner, the entire area where the adhesive portion 184 is to be formed is irradiated with the laser beam.

By the application of the laser beam, the surface of the metal thin film 188 melts and vaporizes to form the plurality of recesses 188a. The surface layer metal of the melting and vaporizing metal thin film 188 is vapor-deposited on the portion irradiated with the laser beam (that is, the area where the adhesive portion 184 is to be formed) and the periphery of the portion irradiated with the laser beam (that is, an area where the non-adhesive portion 185 is to be formed). In this way, the uneven oxide film 189 that is thicker at the adhesive portion 184 and thinner at the non-adhesive portion 185 is formed. The uneven oxide film 189 having the higher protrusions 189a at the adhesive portion 184 and the lower protrusions 189a at the non-adhesive portion 185 is formed.

At the mounting portion 182, the uneven oxide film 189 is not formed on the surface of the metal thin film 188, and a natural oxide film (not shown) is formed. Because the natural oxide film is thinner than the uneven oxide film 189 at the non-adhesive portion 185, the natural oxide film is reduced and removed during the reflow of the solder 16, e.g., reduced-pressure reflow under a hydrogen atmosphere.

<Positional Relationship Between Semiconductor Chip and First Heat Sink>

FIG. 5 and FIG. 6 are views schematically showing a periphery of the semiconductor chip 12 and the first heat sink 18.

As shown in FIG. 5, the semiconductor chip 12 (semiconductor board 120) includes an active area 124 and an outer peripheral area 125. The element described above is formed in the active area 124, and the active area 124 is an area where the current flows to generate heat. The outer peripheral area 125 is an area that relaxes the electric field of the active area 124. The outer peripheral area 125 is a portion on the outer side as compared with the active area 124. In the outer peripheral area 125, for example, a guard ring is formed. For example, the active area 124 has a substantially rectangular shape in plan view. The outer peripheral area 125 has a substantially rectangular annular shape in plan view. A width of the outer peripheral area 125 is, for example, about 0.5 mm.

As shown in FIG. 5 and FIG. 6, in the present embodiment, the entire area of the non-adhesive portion 185 are placed in an area overlapping the outer peripheral area 125 in a projection view in the Z direction. In other words, the entire area of the non-adhesive portion 185 is placed directly below an area below an outer peripheral end 124a of the active area 124 and an outer peripheral end 120a of the semiconductor board 120 (semiconductor chip 12). In the total length of the non-adhesive portion 185, the entire area of the width is placed in the area overlapping the outer peripheral area 125. The width is a length in a direction orthogonal to the longitudinal direction (extension direction).

As described above, the width of the non-adhesive portion 185 is 0.2 mm to 0.3 mm. In the present embodiment, over the full length of the non-adhesive portion 185, the circumference of the non-adhesive portion 185 is located outside the outer peripheral end 124a of the active area 124. Therefore, the outer peripheral end of the mounting portion 182 is located outside the outer peripheral end 124a. In the solder 16, a connection area with the first heat sink 18 is smaller than a connection area with the semiconductor chip 12, and larger than an area along the XY plane of the active area 124. Immediately under the active area 124, there is the solder 16 up to the one face 180 of the first heat sink 18.

On the other hand, the outer peripheral end of the non-adhesive portion 185 is located inside the outer peripheral end 120a of the semiconductor board 120, in other words, the position of outer peripheral end of the non-adhesive portion 185 is an inner position as compared with the outer peripheral end 120a. Therefore, an inner peripheral end of the adhesive portion 184 is located on the inner side as compared with the position of the outer peripheral end 120a. That is, a part of the adhesive portion 184 is inserted into an area overlapping the outer peripheral area 125. The adhesive portion 184 is inserted directly under the semiconductor chip 12 over the full length.

<Effect of Semiconductor Device>

FIG. 7 and FIG. 8 show a comparative example of the semiconductor device and the SAT image. In the comparative example, "r" is attached to the end of the reference numerals of the related features shown in the present embodiment.

In a semiconductor device 10r of the comparative example, a non-adhesive portion 185r is placed in an area that does not overlap a semiconductor chip 12r in the projection view in the Z direction, that is, is placed outside the semiconductor chip 12.

FIG. 7 shows a state where a void 40r is generated adjacent to the non-adhesive portion 185r and the solder 16r. The void 40r may be formed due to air trapped in molding of a sealing resin body 14r, air in a resin tablet that is material of the sealing resin body 14r, vaporization of absorbed moisture, and the like. As shown in FIG. 14, it is confirmed that the solder stain is larger when the void 40r is formed. Moreover, it is confirmed that the solder strain increases as the thickness (size) of the void 40r increases. As shown in FIG. 7, when the void 40r has a thickness that contacts with an end face of the semiconductor chip 12r, the effect on the solder strain is large, and a connection reliability of the solder 16 is lowered. Therefore, it is important to detect such a void 40r.

For the detection of the void 40r, for example, SAT device can be used. However, in a case where the void 40r is detected from, in the Z direction, a side close to solder 16r, specifically, a side close to a first heat sink 18r, when the peeled sealing resin body 14r at the non-adhesive portion 185 exits before the void 40r, the SAT image is obtained as shown in FIG. 8. Reference numeral 41r shown in FIG. 8 designates a peeled portion 41r of the sealing resin body 14r from the non-adhesive portion 185r. In such a manner, the void 40r is hidden behind the peeled portion 41r, and it is not possible to distinguish between the void 40r and the peeled portion 41r. That is, it is not possible to detect the void 40r.

On the other hand, in the present embodiment, over the entire length of the non-adhesive portion 185, the entire width is placed in an area overlapping the outer peripheral area 125. FIG. 9 shows a state where a void 40 occurs similarly to the comparative example (see FIG. 7). The void 40 contacts the end face of the semiconductor chip 12. When such a void 40 occurs, the SAT image is obtained as shown in FIG. 10. On the other hand, when the void 40 does not occur or when the small void 40 occurs so as not to contact the end face of the semiconductor chip 12, the SAT image is obtained as shown in FIG. 11. The SAT image is significantly different between FIG. 10 and FIG. 11.

When the void 40 has the thickness that contacts the end face of the semiconductor chip 12, at least a part of the void 40 is located on the outer side as compare with the non-adhesive portion 185 (peeled portion 41). Accordingly, the void 40 having the large effect on the solder strain can be detected from the difference in the SAT image. Even when the void 40 does not contact the end face of the semiconductor chip 12, it may be possible to detect the void 40 that has at least a part located on the outside the non-adhesive portion 185. The peeled portion 41 is formed by peeling the sealing resin body 14 on the non-adhesive portion 185.

The adhesive portion 184 is inserted directly under the semiconductor chip 12 at a position where the entire width is adjacent to the non-adhesive portion 185 directly under the semiconductor chip 12. In this configuration, as compared with the configuration where the non-adhesive portion is placed outside the semiconductor chip, the distance between the semiconductor chip 12 and the adhesive portion 184 is smaller. Accordingly, a reinforcing effect of the solder 16 by the sealing resin body 14 is enhanced, and therefore it may be possible to more reduce a thermal stress acting on the solder 16. That is, it may be possible to reduce the solder strain.

Further, the non-adhesive portion 185 is placed in the area overlapping the outer peripheral area 125. That is, the non-adhesive portion is not placed in the active area 124. Thereby, it may be possible to effectively dissipate the heat generated at the semiconductor chip 12 to the first heat sink via the solder 16. Accordingly, it may be possible to detect the void 40 with high accuracy while improving the heat dissipation. The non-adhesive portion 185 may be placed in a range from the outer peripheral end 124a to the outer peripheral end 120a. For example, the inner peripheral end of the non-adhesive portion 185 may be conformed to the outer peripheral end 124a, and the outer peripheral end of the non-adhesive portion 185 may be conformed to the outer peripheral end 120a.

Further, over the entire length of the non-adhesive portion 185, the entire width is placed in the area overlapping the semiconductor chip 12, specifically, the area overlapping the outer peripheral area 125. Thereby, even when the thick void 40 occurs at any position around the semiconductor chip 12, it may be possible to detect the void 40 by distinguishing the void 40 from the peeled portion 41 of the non-adhesive portion 185.

Further, by applying the laser beam, the uneven oxide film 189 having the fine recesses is formed closer to the one face 180 of the first heat sink 18. The laser beam is applied and the portion with the higher protrusions 189a, that is, the portion with the thicker uneven oxide film 189 serves as the adhesive portion 184. Since the portion roughened by the application of the laser beam is used as the adhesive portion 184, it is easy to locally form the adhesive portion 184.

The peripheral portion of the adhesive portion 184 with the lower protrusions 189a, that is, the portion with the thinner uneven oxide film 189 serves as the non-adhesive portion 185. In this manner, the uneven oxide film 189 is formed throughout the area where the non-adhesive portion 185 is formed. The fine recesses and protrusions are formed on the surface of the uneven oxide film 189, and the non-adhesive portion 185 has lower wettability by the solder 16 than the mounting portion 182. Therefore, it may be possible to allow the solder 16 to wet and spread in the area on the inner side of the uneven oxide film 189, that is, on the inner side of the non-adhesive portion 185. Therefore, it is easy to define the mounting portion 182. In other words, it is easy to obtain the non-adhesive portion 185 having the desired width.

The position of the non-adhesive portion 185 is not limited to the example described above. At at least a part of the entire length of the non-adhesive portion 185, the entire area of the width may be placed in an area overlapping the semiconductor chip 12. Thereby, it may be possible to detect the void 40 with higher accuracy. For example, a part of the non-adhesive portion 185 may be placed in an area overlapping the active area 124. More preferably, the configuration described above is preferable.

Second Embodiment

The present embodiment can refer to the preceding embodiment. Therefore, the descriptions of the same parts in the semiconductor device 10 shown in the preceding embodiment will be omitted.

As shown in FIG. 12, in the present embodiment, the non-adhesive portion 185 is placed in the area overlapping the semiconductor chip 12, and is placed directly under at least one of corners of the semiconductor chip 12 having the substantially rectangular shape in plan view. FIG. 12 corresponds to FIG. 5.

The semiconductor chip 12 has four corners. In FIG. 12, at each of the four corners, the entire width of the non-adhesive portion 185 is placed in an area overlapping the outer peripheral area 125. On the other hand, the entire width of the non-adhesive portion 185 is placed outside a side portion connecting the corners of the semiconductor chip 12.

The solder strain is larger at the corners (corner part) than at the side portion of the semiconductor chip 12. Therefore, it is desired to especially detect the void 40 adjacent to the corner. According to the present embodiment, the non-adhesive portion 185 is placed in the area overlapping the corner. Accordingly, it may be possible to detect the void that occurs at the corner. Thereby, it may be possible to prevent the solder strain at the corner from increasing. The effect can also be provided by the configuration shown in the preceding embodiment, specifically, the configuration in which the entire length of the non-adhesive portion 185 is placed in the area overlapping with the outer peripheral area 125.

At only the corner, the non-adhesive portion 185 overlaps the outer peripheral area 125. At the other portion, the non-adhesive portion 185 is placed so as not to overlap the semiconductor chip 12. Thereby, a heat dissipation path from the semiconductor chip 12 to the first heat sink 18 becomes large. Accordingly, it may be possible to improve the heat dissipation. Since the distance between the semiconductor chip 12 and the adhesive portion 184 at the corner is small, it may be possible to reduce the heat stress acting on the solder 16. That is, it may be possible to improve the heat dissipation while reducing the solder strain.

The example in which the non-adhesive portion 185 is placed directly under all the corners is shown. It is not limited to this. The non-adhesive portion 185 may be placed directly under at least one corner. The planar shape of the semiconductor chip 12 is not limited to the rectangular shape. The semiconductor chip 12 has to be formed in a plane polygonal shape.

The semiconductor device 10 having the 1-in-1 package structure including one semiconductor chip 12 is shown. However, it is not limited to this. For example, it can be applied to a configuration including two semiconductor chips 12 configuring the upper-lower arm circuit.

Although the example in which the IGBT and the FWD are formed on the same semiconductor chip 12 is shown, the present disclosure is not limited to this example. The IGBT and the FWD may be formed on separate chips.

Although the example in which the back face 181 of the first heat sink 18 and the back face 301 of the second heat sink 30 are exposed from the sealing resin body 14 is shown, the present disclosure is not limited to this example. At least one of back faces 181, 301 may be covered with a sealing resin body 14.

Metal forming the metal thin film 188 is not limited to Ni. That is, the uneven oxide film 189 is not limited to the oxide of Ni. The uneven oxide film 189 only has to be an oxide of metal forming the metal thin film 188.

Although the roughened portion formed by the application of the laser beam is shown as an example of the roughened portion forming the adhesive portion 184, the roughed portion is not limited to this example. For example, by giving roughening plating, the sealing resin body 14 may adhere only to the adhesive portion 184, and the sealing resin body 14 may not adhere to the non-adhesive portion 185.

The semiconductor device 10 has to include, at least, the semiconductor chip 12 having the active area 124 and the outer peripheral area 125, the metal member (first heat sink 18) having the mounting portion 182 and the peripheral portion 183 for the semiconductor chip 12, the joining member (solder 16) interposed between the semiconductor chip 12 and the mounting portion 182, and the sealing resin body 14, the mounting portion 182 and the peripheral portion 183 being portions of the one face close to the semiconductor chip 12. Accordingly, the present disclosure is not limited to the semiconductor device 10 having the double-face heat dissipation structure described above, and can also be applied to the semiconductor device 10 having a single-face heat dissipation structure as illustrated in FIG. 13.

In FIG. 13, the semiconductor chip 12 is connected to the mounting portion 182 of the heat sink 18 via the solder 16.

A lead 34 is connected to the semiconductor chip 12. In FIG. 13, the semiconductor chip 12 is connected to the lead 34 via a bonding wire 36. The mounting portion 182 and the peripheral portion 183 have the similar configuration to the preceding embodiment (see FIG. 2).

In the above, the embodiments, the configurations, the aspects of the semiconductor device according to the present disclosure are exemplified. The present disclosure is not limited to the above-described embodiments, each configuration and each aspect related to the present disclosure. For example, embodiments, configurations, and examples obtained from an appropriate combination of technical elements disclosed in different embodiments, configurations, and examples are also included within the scope of the embodiments, configurations, and examples of the present disclosure.

The invention claimed is:

1. A semiconductor device comprising:
    a semiconductor chip that includes
        an active area and
        an outer peripheral area surrounding the active area;
    a metal member that includes one face including
        a mounting portion on which the semiconductor chip is mounted and
        a peripheral portion surrounding the mounting portion;
    a joining member that
        is interposed between the semiconductor chip and the mounting portion and connects the semiconductor chip and the metal member; and
    a sealing resin body that integrally seals the semiconductor chip, at least the one face of the metal member and the joining metal member,
    wherein:
    the metal member includes, as the peripheral portion,
        an adhesive portion that
            surrounds the mounting portion and
            adheres to the sealing resin body, and
        a non-adhesive portion that is
            placed between the mounting portion and the adhesive portion,
            is not connected to the joining member,
            has lower adhesion to the sealing resin body than adhesion of the adhesive portion, and
            has an annular shape; and
    at, at least, a part of an entire length of the non-adhesive portion, an entire width is placed in an area overlapping the semiconductor chip in a projection view in a thickness direction of the semiconductor chip.

2. The semiconductor device according to claim 1, wherein:
    at, at least, a part of the entire length of the non-adhesive portion, the entire width is placed in an area overlapping the outer peripheral area.

3. The semiconductor device according to claim 1, wherein:
    a shape of a plane of the semiconductor chip is a polygonal shape; and
    the non-adhesive portion is placed at at least one corner in the area overlapping the semiconductor chip.

4. The semiconductor device according to claim 1, wherein:
    the entire width of the entire length of the non-adhesive portion is placed in the area overlapping the semiconductor chip.

5. The semiconductor device according to claim 1, wherein:
    the adhesive portion is a roughened portion having a continuously uneven surface.

6. The semiconductor device according to claim 5, wherein:
    the metal member includes
        a metal base and
        a film formed on a surface of the metal base;
    the film includes
        a metal thin film formed on the surface of the metal base and
        an uneven oxide film that is an oxide of an identical metal with a main component metal of the metal thin film and has a continuously uneven surface;
    the uneven oxide film is placed at
        an entire area of the adhesive portion and
        at least a portion close to the adhesive portion in the non-adhesive portion; and
    a height of a convex portion of the uneven oxide film of the adhesive portion is higher than a height of a convex portion of the uneven oxide film of the non-adhesive portion.

* * * * *